(12) United States Patent
Mollard et al.

(10) Patent No.: US 9,397,244 B2
(45) Date of Patent: Jul. 19, 2016

(54) CDHGTE PHOTODIODES ARRAY

(71) Applicant: COMMISSARIAT A L'ENERGIE ATOMIQUE ET AUX ENERGIES ALTERNATIVES, Paris (FR)

(72) Inventors: Laurent Mollard, Claix (FR); Guillaume Bourgeois, Grenoble (FR); Gerard Destefanis, Saint-Egreve (FR)

(73) Assignee: Commissariat a' l'energie atomique et aux energies alternatives, Paris (FR)

( * ) Notice: Subject to any disclaimer, the term of this patent is extended or adjusted under 35 U.S.C. 154(b) by 0 days.

(21) Appl. No.: 14/686,084

(22) Filed: Apr. 14, 2015

(65) Prior Publication Data
US 2015/0303322 A1  Oct. 22, 2015

(30) Foreign Application Priority Data

Apr. 22, 2014   (FR) ..................... 14 00950

(51) Int. Cl.
| | |
|---|---|
| H01L 31/0296 | (2006.01) |
| H01L 27/144 | (2006.01) |
| H01L 31/103 | (2006.01) |
| H01L 31/18 | (2006.01) |
| H01L 31/0352 | (2006.01) |

(52) U.S. Cl.
CPC ...... *H01L 31/02966* (2013.01); *H01L 27/1443* (2013.01); *H01L 27/1446* (2013.01); *H01L 31/02963* (2013.01); *H01L 31/03529* (2013.01); *H01L 31/1032* (2013.01); *H01L 31/1832* (2013.01)

(58) Field of Classification Search
CPC .......... H01L 31/02966; H01L 27/1446; H01L 31/03529; H01L 31/1032; H01L 31/1832; H01L 27/1443; H01L 31/02963
See application file for complete search history.

(56) References Cited

U.S. PATENT DOCUMENTS

| | | |
|---|---|---|
| 4,588,446 A | 5/1986 | Tregilgas |
| 4,961,098 A | 10/1990 | Rosbeck et al. |

(Continued)

FOREIGN PATENT DOCUMENTS

| | | |
|---|---|---|
| EP | 0 445 545 A1 | 9/1991 |
| FR | 2 983 351 | 5/2013 |
| JP | 62-119976 | 6/1987 |

OTHER PUBLICATIONS

U.S. Appl. No. 14/795,129, filed Jul. 9, 2015, Mollard, et al.

(Continued)

*Primary Examiner* — David Vu
(74) *Attorney, Agent, or Firm* — Oblon, McClelland, Maier & Neustadt, L.L.P.

(57) ABSTRACT

A photodiodes array includes a useful layer made of $Cd_xHg_{1-x}Te$; first doped zones each forming a PN junction with a second doped zone surrounding the first doped zones. The array includes regions located between two PN junctions, with a cadmium concentration gradient decreasing from the upper face to the lower face of the useful layer. A method of making such a photodiodes array includes producing, on the upper face of the useful layer, of a structured layer with at least one through opening, and with a cadmium concentration higher than the cadmium concentration in the useful layer; annealing the useful layer covered by the structured layer, with diffusion of cadmium atoms of the structured layer, from the structured layer to the useful layer; producing at least two PN junctions in the useful layer.

15 Claims, 3 Drawing Sheets

(56) References Cited

U.S. PATENT DOCUMENTS

| | | | |
|---|---|---|---|
| 5,880,510 A | | 3/1999 | Cockrum et al. |
| 6,030,853 A | * | 2/2000 | Tregilgas .............. H01L 21/388 257/E21.469 |
| 2014/0312446 A1 | | 10/2014 | Gravrand et al. |
| 2014/0319580 A1 | | 10/2014 | Mollard et al. |
| 2014/0339570 A1 | | 11/2014 | Mollard et al. |
| 2014/0346539 A1 | | 11/2014 | Mollard et al. |

OTHER PUBLICATIONS

French Preliminary Search Report issued Jan. 8, 2015 in French Application 14 00950, filed on Apr. 22, 2014 (with English Translation of Categories of Cited Documents).

U.S. Appl. No. 14/705,078, filed May 6, 2015, Mollard, et al.

\* cited by examiner

CDHGTE PHOTODIODES ARRAY

TECHNICAL FIELD

This invention relates to the field of infrared CdHgTe photodiodes used to detect infrared radiation.

STATE OF PRIOR ART

Prior art makes use of different sorts of photodiode arrays and particularly photodiode arrays made of a semiconducting material layer made of a cadmium, mercury and tellurium alloy $Cd_xHg_{1-x}Te$, where x is a real between 0 and 1 with the limits being excluded. Throughout this text, all of this layer made of a semiconducting material is referred to as the "useful layer". Throughout this text, the useful layer denotes the entire layer made of a semiconducting material including the photon absorption region with a first N or P doping type, PN junctions and so-called doped zones with a second P or N doping type.

These photodiode arrays are used for example in the spatial field for detection of infrared radiation and particularly Middle Wave Infrared (MWIR, corresponding to wavelengths between 4 µm and 5 µm at 80 K) and Long Wave Infrared (LWIR, corresponding to wavelengths of more than 8 µm at 80 K).

They can also be used for detection of Small Wave Infrared (SWIR, corresponding to wavelengths between 2 and 3 µm at 80 K), and Very Long Wave Infrared (VLWIR, corresponding to wavelengths longer than 12 µm at 80 K).

For example, rectangular arrays containing 640×512 photodiodes may be made for a pitch of 15 µm (width of a photodiode).

The quality of a photodiode array may be quantified by different indicators.

For example, one of these indicators is its modulation transfer function (MTF). It is usually represented by a graph representing a ratio between a measured contrast and a theoretical contrast depending on a frequency (in this case the inverse of the pitch of the photodiodes array). The MTF illustrates the capacity of the photodiodes array to faithfully transcribe a distribution of incident photons in the form of a map of currents measured on the photodiodes. Therefore it is advantageous that a photodiodes array should have a good MTF, so that it can provide an image that faithfully transcribes reality.

Another indicator is its so-called darkness current. The darkness current is the residual electrical current of a photodetector in the absence of any light illumination.

One purpose of this invention is to propose an array of $Cd_xHg_{1-x}Te$ photodiodes with an improved quality with regard to at least one of the indicators commonly used to quantify this quality.

Another purpose of this invention is to propose a method of fabrication of such a photodiodes array.

PRESENTATION OF THE INVENTION

This objective is achieved with a photodiodes array comprising:
- a so-called useful layer made of a semiconducting alloy of cadmium, mercury and tellurium of the $Cd_xHg_{1-x}Te$ type, the useful layer having an upper face and a lower face;
- at least two first doped zones located in the useful layer, each forming a PN junction with a second doped zone surrounding the first doped zones, the PN junctions being flush with the upper face of the useful layer.

According to the invention, the array comprises at least one region located between two neighbouring PN junctions and has a cadmium concentration gradient decreasing from the upper face to the lower face of the useful layer.

Advantageously, the average concentration of cadmium in said region is higher than the average concentration of cadmium in the remainder of the useful layer.

According to a first embodiment, said region extends between two PN junctions and is outside each first doped zone.

According to this first embodiment, said region may extend in the useful layer deeper than the first doped zones.

According to a second embodiment, said region extends between two PN junctions and in an upper peripheral volume of each of the first doped zones.

According to this second embodiment, said region can extend in the useful layer less deep than the first doped zones.

Said region may extend in a first doped zone over less than half of the volume of this first doped zone.

According to a third embodiment, said region has:
- a first portion extending outside the first doped zones; and
- a second portion extending in an upper peripheral volume of at least one first doped zone;

the first portion extending deeper in the useful layer than the second portion and the first portion being surrounded by the second portion.

The first doped zone is advantageously P-doped by arsenic atoms.

The invention also relates to a method of fabrication of a photodiodes array according to the invention comprising the following steps:
- production on the upper face of the useful layer, of a so-called structured layer with at least one through opening, and with a cadmium concentration higher than the cadmium concentration in the useful layer;
- annealing of the useful layer covered by the structured layer, with diffusion of cadmium atoms of the structured layer, from the structured layer to the useful layer;
- production of at least two PN junctions in the useful layer.

The production of a structured layer may involve:
- a deposit of a reservoir layer on the upper face of the useful layer; and
- etching of at least one through opening in the reservoir layer, the etching being a chemical etching.

The steps of production of a structured layer and annealing advantageously form a fabrication cycle and at least two fabrication cycles are implemented.

The step of production of the PN junctions may make use of an arsenic ion implantation.

Preferably, annealing is done at a temperature of between 100° C. and 500° C.

Annealing is advantageously done for a duration of between 1 h and 100 h.

BRIEF DESCRIPTION OF THE DRAWINGS

This invention will be better understood after reading the description of example embodiments given purely for information and in no way restrictive with reference to the appended drawings in which.

DETAILED PRESENTATION OF PARTICULAR EMBODIMENTS

For reasons of clarity, we will start by illustrating a method of fabricating a photodiodes array according to the invention. The steps in such a method are shown diagrammatically in FIG. 1.

Figure 1:
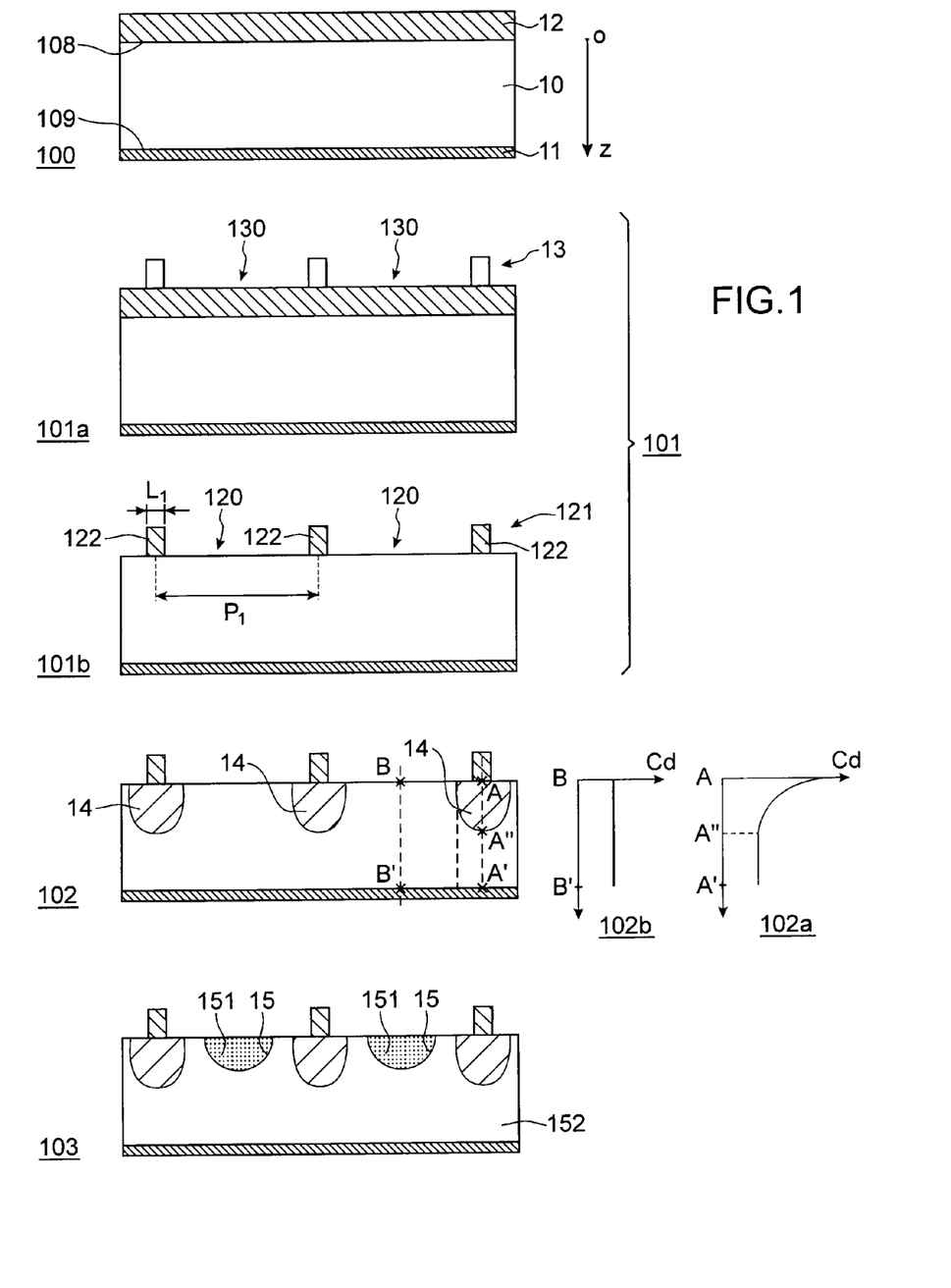
FIG. 1 diagrammatically shows a first embodiment of the method according to the invention.

The starting point is a useful layer 10 made of a semiconducting material made from a cadmium, mercury and tellurium $Cd_xHg_{1-x}Te$ alloy where x is a real between 0 and 1, the limits being excluded. x is typically between 0.2 and 0.4, for example x=0.22. In this example, the composition of the useful layer 10 is initially constant in space.

For example, it is required to detect radiation in the middle wave infrared (MWIR) corresponding to a cadmium concentration x=0.3. As a variant, it might be required to detect radiation in the long wave infrared (LWIR) corresponding to a cadmium concentration defined by x=0.22.

This useful layer 10 in this case is made on a substrate 11, for example a substrate made of cadmium, zinc and tellurium alloy. Such an alloy very advantageously matches the mesh of the material of the useful layer 10 with that of the substrate 11. The substrate 11 is advantageously transparent to wavelengths that are to be detected. According to one variant not shown, the substrate is separated from the useful layer before, during or after carrying out of the method according to the invention.

The thickness of the useful layer 10 is typically between 0.1 μm and 20 μm, for example 15 μm. The substrate 11 is of the order of 500 μm thick. For reasons of clarity in the figures, the thickness of the substrate 11 is under-sized in the figures.

The useful layer is advantageous made on the substrate 11 by a so-called liquid phase epitaxy technique. Liquid phase epitaxy is a technique for growth of a crystal in which the substrate 11 is brought into contact with a liquid phase of a required element (in this case $Cd_xHg_{1-x}Te$) that crystallises on the substrate. As a variant, the useful layer may be made on the substrate 11 by a so-called molecular beam epitaxy technique. Molecular beam epitaxy is a technique for growth of a crystal in which elements to be deposited on the substrate 11 are evaporated and will then deposit on the substrate. Any other technique for deposition of a crystalline layer on a substrate could be envisaged, for example chemical vapour phase deposition.

For example, the useful layer may be in the form of a parallelepiped and particularly a rectangular parallelepiped. A z-axis, defining the depth axis, is defined in this useful layer starting from the upper face 108 and connecting faces 108 and 109. Face 109 is a lower face in contact with the substrate 11. Face 108 is an upper face of the side opposite the lower face 109.

Step 100:

During step 100, a so-called reservoir layer 12 is deposited on the upper face 108 of the useful layer 10. One of the elements of the reservoir layer is cadmium, the cadmium concentration in the reservoir layer being higher than the cadmium concentration in the useful layer 10.

The reservoir layer 12 is of the order of one micrometer thick, for example between 0.1 μm and 2 μm, and particularly 1 μm.

The reservoir layer 12 is deposited by any known technique for thin layer deposition. The reservoir layer is made from a binary, ternary, quaternary or even higher material, particularly from elements in columns II and VI: for example and non-limitatively CdS, CdSe, CdTe, CdZnSe, CdMnSSe . . . .

The reservoir layer 12 thus forms a uniform layer that covers the entire upper face 108 of the useful layer 10.

Step 101:

The reservoir layer 12 is then etched so as to form through openings 120. This is called the structuring or texturing of the reservoir layer 12. The reservoir layer forms a so-called structured layer 121 after structuring. Therefore the structured layer 121 has the same cadmium concentration as the reservoir layer.

In the example shown in FIG. 1, the structured layer 121 consists of pads 122 or lines for example with a width $L_1$ equal to 1 μm, and distributed in a square mesh at a pitch $P_1$ of 15 μm.

The structured layer may form a mesh with any type of elementary shape, for example round, square or any other shape. For simplification reasons, it may commonly be said, that each shape is intended to surround a photodiode (see below). Each shape intended to surround a photodiode may be continuous or discontinuous (for example continuous or dashed circle). The structured layer may also be such that only some photodiodes will be surrounded by an elementary shape.

This structured layer may also have a variable width from one location to another along a shape that will surround a photodiode, for example varying from a width of 2 μm to 4 μm.

Those skilled in the art will be capable of adapting deposition and etching conditions as a function of the required characteristics of the structure.

Step 101 is decomposed for example into two steps 101a and 101b.

Step 101a:

In a first step 101a, a resin layer is deposited on the reservoir layer 12, and through openings 130 are then etched in this resin. This will preferably be a photolithography etching. This thus forms a resin mask 13 located on the reservoir layer 12.

Step 101b:

The reservoir layer 12 is etched in a second step 101b through the resin mask 13. Thus, the reservoir layer 12 is etched only at the locations not covered by the resin.

The etching is advantageously a chemical etching, typically a chemical etching using a bromine solution (dibromine solution $Br_2$).

The etching depth is adjusted by adjusting the duration of chemical etching. In practice, the appearance of the reservoir layer may be different from the appearance of the useful layer, therefore the moment starting from which chemical etching should be stopped can be identified optically.

Other methods of structuring the cadmium reservoir can also be envisaged, such as selective chemical etching stopping on the useful layer or ionic or plasma type dry etching. Any other reservoir structuring technique could also be envisaged.

The following steps:

deposition 100 of a reservoir layer 12 on the upper face 108 of the useful layer, with a cadmium concentration higher than the average cadmium concentration in the useful layer 10; and etching 101 of at least one through opening 120 in the reservoir layer thus forming a so-called structured layer 121;

form a step to make a structured layer 121 on said upper face 108, with at least one through opening 120 and with a cadmium concentration higher than the average cadmium concentration in the useful layer 10.

It could also be envisaged to make the structured layer 121 using a "lift-off" technology. For example, a structured resin layer could be deposited on the upper face 108 and covered by the reservoir layer 12. Therefore the reservoir layer is deposited on the resin where the resin is present, and on the useful layer 10 at the through openings in the resin. The structured layer 121 is obtained by removing the resin.

Step 102:

The next step is to anneal the assembly formed by the useful layer 10 and the structured layer 121. For example, this annealing may be done at a temperature of between 100° C. and 500° C., and preferably between 300° C. and 500° C., for a duration that can vary from a few minutes to several hours, for example between 1 hour and 40 hours. In the example shown in FIG. 1, annealing corresponds to heating at 430° for 50 hours.

For all necessary annealing, those skilled in the art will be able to perform annealing under pressure and temperature conditions that limit degradation of the material.

The cadmium atoms of the structured layer 121 will diffuse towards the useful layer 10 during this annealing. This is why we can refer to a diffusion annealing.

Thus, regions 14 are formed in the useful layer, each having a decreasing cadmium concentration gradient from the upper face 108 to the lower face 109 of the useful layer.

Graphs 102a and 102b represent a cadmium concentration Cd in the useful layer (abscissa axis) as a function of the depth in the useful layer (ordinate axis).

The graph 102b corresponds to a section in the useful layer along the axis BB' that does not pass in a region 14 like that described above. It can be clearly seen that the cadmium concentration then has a constant value corresponding to the initial cadmium concentration in the useful layer.

The graph 102a corresponds to a section in the useful layer along the AA' axis passing in a region 14 like that described above. The cadmium concentration has a progressively decreasing profile from the upper face 108 in the direction of the lower face 109. For example, this gradient is equal to a maximum value defined by x=0.5 in $Cd_xHg_{1-x}Te$, and a minimum value defined by x=0.22 corresponding to the initial concentration of cadmium in the useful layer. The gradient and therefore the region 14 extends in the useful layer as far as A". Throughout the text, a constant concentration of cadmium does not define a concentration gradient.

We could consider surfaces in the useful layer parallel to the upper face 108 defined by a depth z in the useful layer. Beyond a predetermined depth $z=z_0$ (see FIG. 3) in the useful layer 10, the average cadmium concentration at the intersection of a such a surface with the regions 14 is higher than the average cadmium concentration at the intersection of this surface with the remainder of the useful layer.

Figure 3:
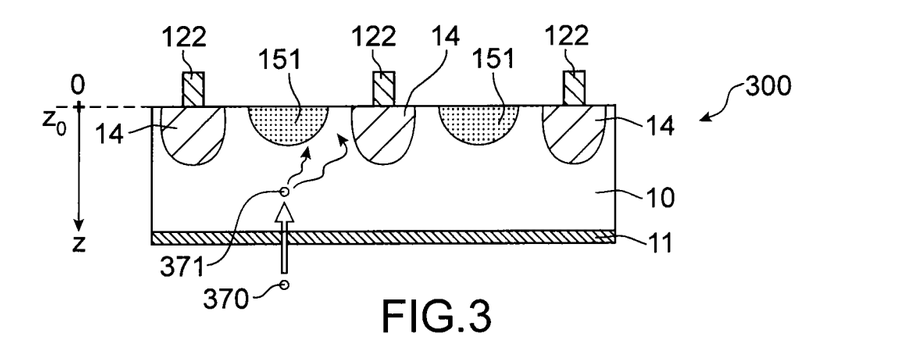
FIG. 3 diagrammatically shows a first embodiment of the photodiodes array according to the invention.

In particular we have $z_0=0$. In other words, the average cadmium concentration in regions 14 is higher than the average cadmium concentration in the remainder of the useful layer, and particularly in a region that will form an absorption region of the useful layer, in which photons with a wavelength to be detected will form minority carriers.

Regions 14 may be called "3D hetero-structure". All of the regions 14 open up on the upper surface 108.

Those skilled in the art will be capable of adapting the temperature and the annealing duration depending on the required characteristics of the profile of the cadmium concentration gradient in the regions 14.

Diffusion of atoms and particularly cadmium atoms may be approximated by a Fick type standard diffusion law:

$$n(z, t) = \frac{1}{\sqrt{\pi Dt}} e^{-\frac{z^2}{4Dt}},$$

where
- n(z, t) is the concentration per unit volume of atoms of a given species as a function of the depth z and time t;
- t is the annealing duration;
- D is the coefficient of diffusion of the atom, where $D=D_0 e^{-Ea/kT}$, T is the annealing temperature and Ea is the diffusion activation energy (quantity of energy necessary to start the atom diffusion process).

Graph 102a shows that the cadmium concentration gradient follows a decreasing curve starting from the upper face 108 (point A) and towards the lower face 109 (as far as point A"), following an approximately exponential decrease.

Step 103:

At least two PN junctions 15 are produced in the useful layer during step 103. Each PN junction forms a photodiode.

The PN junctions are made between the regions 14, for example by ionic implantation between pads 122.

There is a first doped zone 151 corresponding to each photodiode. Each PN junction separates a first doped zone 151 from a second doped zone 152 common to each of the photodiodes. The second doped zone 152 surrounds the first doped zones 151 and has a different doping type (N or P). Each PN junction forms a convex surface in the useful layer between one of the first doped zones 151 and the second doped zone 152.

The PN junctions are flush on the upper face 108 of the useful layer.

It could be envisaged to make a PN junction according to one of many techniques known in prior art.

Advantageously, a P-doped zone (excess of "holes", or in other words lack of electrons) can be made within an N-doped material (excess of electrons). This is done by implanting a P doping element, preferably arsenic, in the useful layer. The next step is annealing at about 400° C. to activate the P doping element. This annealing creates mercury vacancies in the entire useful layer 10. The result obtained is therefore a strongly P doped zone (due to the implantation of arsenic) and a slightly P doped zone (due to the mercury vacancies). The next step is annealing at about 220° C. under a saturated mercury pressure to fill in the mercury vacancies. The slightly P doped zone becomes N doped. The strongly P doped zone is reference 151 and corresponds to a first doped zone according to the invention. The N doped zone is reference 152 and corresponds to the second doped zone according to the invention.

The doping density in the second doped zone 152 is then of the order of $1 \times 10^{16}$ atoms/cm$^3$. The doping density in the first doped zones 151 is of the order of $10^{18}$ atoms/cm$^3$.

As a variant, it would be possible to make a strongly N doped zone (first doped zone 151) in a P doped material (second doped zone 152). This is done by annealing to adjust the level of mercury vacancies, so as to P dope the rest of the useful layer, then an N doping element, preferably boron, is implanted in the useful layer.

These two first example of creation of a PN junction correspond to ionic implantation. The result obtained is thus a photodiode with a planar structure without an etching step that could impact the darkness current.

As a variant, an avalanche photodiode could be made in the useful layer. The first step is annealing to adjust the level of mercury vacancies so as to P dope the useful layer, and an appropriate technological process is then used to create an N doped zone Any other type of diode could be made.

Step 103 to make PN junctions is advantageously implemented after the regions 14 have been produced. However, it could also be envisaged to make PN junctions before making regions 14, particularly in the case in which the first doped zones 151 are P-doped. Diffusion annealing of cadmium atoms can also activate a P doping element.

Classical steps are then performed to install at least one electrical contact element in contact with the useful layer. This electrical contact element electrically polarises the photodiode.

The layer, corresponding to the structured layer 121 after annealing, can be eliminated. For example chemical etching like that described with reference to step 101b in FIG. 1 could be used.

The result thus obtained is an array of photodiodes 300 like that shown in FIG. 3.

The regions 14 have a cadmium concentration gradient extending in depth in the useful layer, deeper or less deep than the first doped zones 151. The regions 14 with a composition gradient may also pass through the entire useful layer, in other words they may extend as far as the lower layer 109.

In the example shown in FIG. 3, the regions 14 extend deeper in the useful layer than the first doped zones 151. For example, the first doped zones 151 extend over a depth of 1 μm in the useful layer 10, and the regions 14 extend over a depth of 3 μm in the useful layer 10. Furthermore, the regions 14 extend outside the first doped zones 151. These two characteristics are obtained due to the use of:

- long annealing at high temperature for in-depth diffusion of cadmium in the useful layer; and
- a structured layer with narrow pads 122, that prevents diffusion of cadmium atoms in the useful layer from spreading the regions 14 so that these regions no longer remain outside the first doped zones 151. A pad is said to be narrow for example when the width of the pads is less than the difference between the pixel pitch and the width of the first doped zones 151 (the first doped zones being assumed to have a fixed width for a given array). In particular, the width of the pads may be at least 1.2 times less than the difference between the pixel pitch and the width of the first doped zones 151, for example it may be half as much.

It is observed that the gap in a $Cd_xHg_{1-x}Te$ semiconducting material depends on the cadmium concentration. The higher this concentration is, the larger the gap is.

Due to the difference between an average cadmium concentration in a region 14 and in the remainder of the useful layer, each region 14 forms an in-depth potential barrier between two neighbouring first doped zones 151 or in other words between two neighbouring photodiodes.

During operation, a photon 370 at a wavelength that is to be detected penetrates into the photodiodes array on the side of its lower face and facing a given photodiode. This photon causes the appearance of a minority carrier 371 in the useful layer 10. This minority carrier 371 diffuses in the useful layer until it recombines with a different nature of carrier. If said minority carrier passes through a PN junction before being recombined, it enables the creation of a measurable current.

The diffusion length of the minority carrier corresponds to the distance travelled before it recombines. Therefore when the diffusion length is high, there is a risk that the minority carrier can recombine after passing through the PN junction of a neighbouring photodiode. This risk is higher if the pitch of the photodiodes array is small relative to the diffusion length.

According to the invention, the photodiodes array has a potential barrier for minority carriers between two neighbouring photodiodes. Therefore, minority carriers are prevented from passing through this potential barrier which prevents a minority carrier from penetrating into the photodiodes array facing a first photodiode and passing through the PN junction of a neighbouring photodiode. Thus, a minority carrier that penetrates into the photodiodes array facing a first photodiode remains enclosed in a corridor between several regions 14 and therefore cannot pass through the PN junction of another photodiode.

This thus prevents an incident photon from:

not causing the appearance of a current in the photodiode in face of which it penetrates into the photodiodes array; and causing the appearance of a current in a photodiode other than the photodiode in face of which it penetrates into the photodiodes array.

Thus, the photodiodes array 300 according to the invention has an improved MTF.

This aspect of the invention is particularly advantageous when it is required that the pitch of the photodiodes array should be less than the diffusion length of minority carriers. Therefore this aspect of the invention is particularly advantageous in the case in which the first doped zone 151 is P-doped and the second doped zone 152 is N-doped (so-called "P on N" technology). With this technology, minority carriers have a long lifespan which means that they have long diffusion lengths (in comparison with the "N on P" technology corresponding to an N-doped zone 151 and a P-doped zone 152).

The required profile of the gap gradient in each region 14 can be obtained by varying the temperature and/or the annealing duration.

It can also be noted that since the regions 14 have the same doping as the second doped zone 152, they do not prevent all photodiodes in the same array from being polarised using a single electrical contact point.

The invention is particularly useful for regions 14 that pass through the useful layer entirely. In this case, the diodes are completely isolated from each other and the MTF is optimum. In this configuration and in order to limit the impact of lateral diffusion of cadmium during the formation of the regions 14, the thickness of the useful layer is advantageously reduced to 1 to 2 μm, for example.

It will also be noted that the invention can be used to make a useful layer providing an excellent crystalline quality because the cadmium gradients are made by diffusion annealing that preserves the crystalline arrangement of $Cd_xHg_{1-x}Te$. The same crystalline quality could not be obtained by localised epitaxy restart techniques.

The invention is particularly useful in the case of a useful layer 10 made by liquid phase epitaxy. One advantage of this technique is that it provides the best crystalline quality. It would be counterproductive to prefer this growth technique of the useful layer, and then to severely deteriorate the crystalline quality of the useful layer (either by contaminations from the external environment or by creating a gap gradient using a technique that does not preserve the high crystalline quality of the useful layer).

Figure 2:
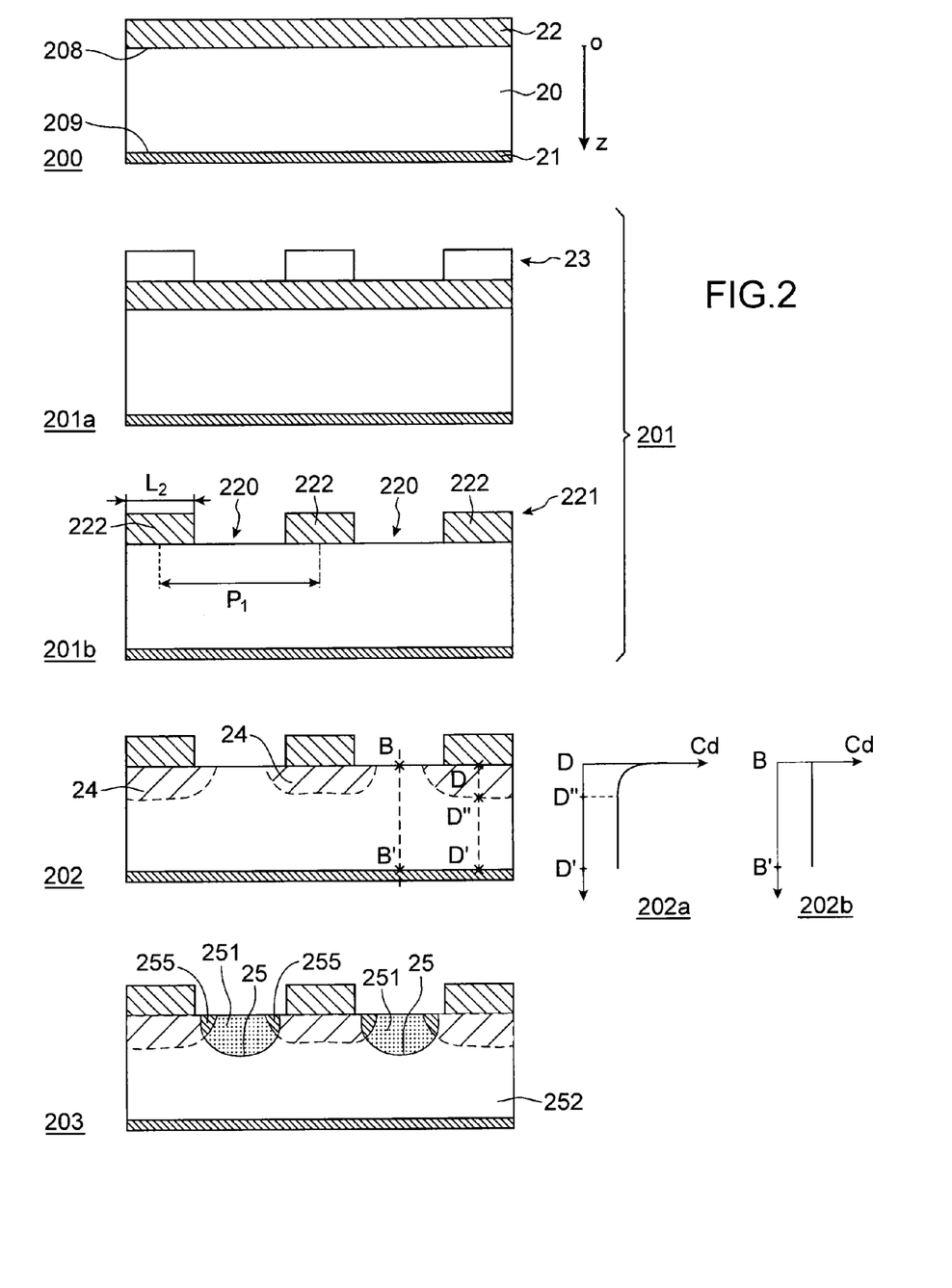
FIG. 2 diagrammatically shows a second embodiment of the method according to the invention.

FIG. 2 diagrammatically shows a second embodiment of the method according to the invention.

The embodiment shown in FIG. 2 will only be described in terms of the differences from the embodiment shown in FIG. 1.

The numeric references 10, 11, 13, 100, 108, 109, 101, 101a, 101b, 120, 121, 122, 102, 102a, 102b, 14, 15, 151, 152 correspond to numeric references 20, 21, 23, 200, 208, 209, 201, 201a, 201b, 220, 221, 222, 202, 202a, 202b, 24, 25, 251, 252 respectively.

In step 201, the structured layer 221 forms pads 222 with a width $L_2$ of 12 μm, and distributed on a square mesh with a pitch $P_1$ equal to 15 μm.

In step 202, an annealing is performed, for example corresponding to heating at 430° for 50 hours.

The graph 202b corresponds to the graph 102b in FIG. 1. The graph 202a corresponds to a section in the useful layer along the DD' axis passing in a region 24. The gradient and therefore the region 24 extend in the useful layer as far as D".

Figure 4:
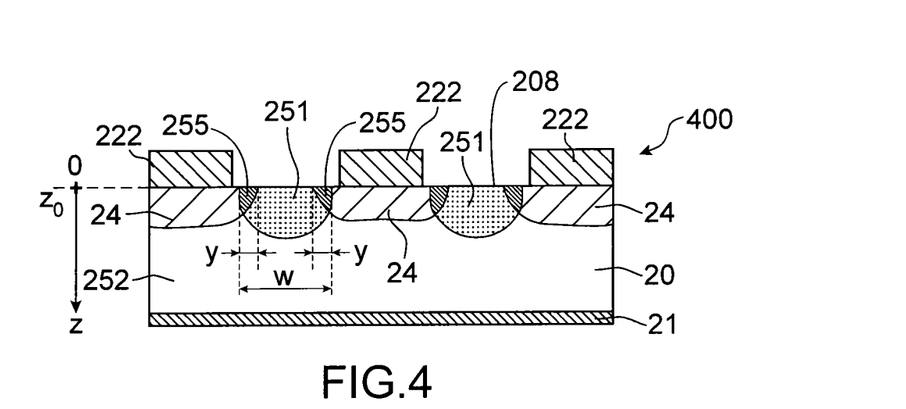
FIG. 4 diagrammatically shows a second embodiment of the photodiodes array according to the invention, and FIG. 5 diagrammatically shows a third embodiment of the photodiodes array according to the invention.

An array of photodiodes 400 like that shown in FIG. 4 is obtained using the method shown in FIG. 2.

The regions 24 and the first doped zones 251 are partially superposed in this case. More precisely, the regions 24 extend in an upper peripheral volume 255 of each of the first doped zones 251. For example, each first doped zone 251 has a width W equal to 8 μm (width at the upper face 208) and its upper peripheral volume 255 has a width y of 2 μm (width at the upper face 208). In a first doped zone 251, the regions 24 extend over about a quarter of the volume of the first doped zone.

Furthermore, in this case the regions 24 do not extend very deep into the useful layer, less deep than the first doped zones 251. For example, the first doped zones 251 extend over a depth of 1 μm in the useful layer 20 and the regions 24 extend over a depth of 0.5 μm in the useful layer 20. Typically, the first doped zones 251 extend in the useful layer deeper than the regions 24, for example 1.5 times deeper. According to this embodiment, optimum performances are obtained for through first doped zones 251 (in other words extending as far as the lower face 209).

These two characteristics are obtained due to the use of:
annealing at lower temperature (280° C. instead of 430° C. in the first embodiment of the method according to the invention), allowing shallower diffusion of cadmium in the useful layer, and/or a shorter annealing time (10 hours instead of 50 hours); and
a structured layer with relatively wide pads 222 so that the regions 24 extend as far as the first doped zones 251. For example, a pad is said to be wide when the width of the pads is greater than the difference between the pixel pitch and the width of the first doped zones 251 (the first doped zones being assumed to have a fixed width for a given array), for example 1.2 times more than this difference.

Therefore the cadmium concentration gradient of the photodiodes array 400 decreases from its upper face 208 towards its lower face 209, and is only present between the first doped zones 251 and on the edges of these first doped zones.

Thus, the edges of the first doped zones 251 are located in a larger gap material, which reduces generation-recombination of carriers in the depletion region. According to this embodiment, a large part of the depletion region (on the edges of the photodiode) is contained in a larger gap material. This local reduction in generation-recombination will cause a reduction in the photodiode darkness current.

The photodiodes array 400 then has a lower darkness current than a photodiodes array according to prior art. In particular, using the same technique for making a PN junction, a photodiode with a lower darkness current is obtained, for example reduced by half.

These observations can be explained as follows:

A photodiode can only detect wavelengths with energy corresponding approximately to the gap of the material in the second doped zone 252.

As described with reference to FIG. 3, a material made of $Cd_xHg_{1-x}Te$ has a gap that depends on the cadmium concentration. A low cadmium concentration results in a small gap and therefore detection of a long wavelength radiation, and vice versa. In practice, detection of infrared radiation is required preferentially, corresponding to a small gap of the material in the second doped zone 252.

However, a disadvantage of a small gap material is that it is more sensitive to defects in the photodiode. The smaller the gap, the more likely it is that material defects introducing an intermediate energy level in the material will contribute to spontaneous crossing of the gap by an electron. Thus, electron-hole pairs are spontaneously formed in the material. An electron-hole pair corresponds to the appearance of a minority carrier (electron or hole) in the useful layer. When the minority carrier passes through a PN junction, an electrical current is measured that does not correspond to absorption of electromagnetic radiation. This is why we talk about a darkness current. The darkness current will thus be a limit to the detection of very weak radiation in the infrared.

There are more defects in the useful layer on the surface, close to the upper face 208. This is explained by the fact that the crystalline quality of an interface cannot be as high as the crystalline quality at the centre of the useful layer. Furthermore, the upper face 208 is the face exposed to the environment, particularly to different treatments applied to the useful layer 20 that can introduce impurities. In particular, these treatments correspond to steps to produce PN junctions. For example, in the case mentioned above of making a PN junction by ionic implantation of arsenic.

Thus, there are more defects in the useful layer close to the upper face 208 and PN junctions, particularly when the PN junctions are made by implantation of arsenic.

There is a cadmium gradient in each of the regions 24 of the photodiodes array 400 according to the invention, which therefore corresponds to a gap gradient called the gap opening.

According to the invention, the photodiodes array has:
a large gap on the surface and between PN junctions, which reduces the sensitivity of the useful layer to defects present on the surface and between PN junctions,
a large gap on the surface and at PN junctions, in upper peripheral volumes 255 of the first doped zones 251, which reduces the sensitivity of the useful layer to defects originating from ionic implantation, and
a gap that remains shallow, in a so-called absorption region, to detect electromagnetic radiation at the required wavelength.

Furthermore, the first doped zones 251 are not enclosed inside a region 24, to avoid limiting quantic efficiency. These first doped zones 251 extend deeper in the useful layer than the regions 24 which further improves the quantic efficiency.

Each gap opening also forms a potential barrier that prevents minority carriers formed in depth in the useful layer from recombining on surface defects, without passing through a PN junction and therefore without forming a current.

It is noted that there is no need for the cadmium concentration gradient to be present in the central volume of the first doped zones 251. The doping density in these first doped zones is usually high enough to limit the impact of existing defects.

Advantageously, the regions 24 cover the first doped zones 251 only on a reduced volume and therefore cover the PN junctions only on a reduced surface area of each PN junction. For example, the regions 24 cover less than 20% of the total surface area of each PN junction. This thus maximises the quantic efficiency by limiting the portions of PN junctions that minority carriers would be unable to access due to the potential barrier associated with a region 24.

Preferably, the regions 24 are present before any step to make a PN junction. Thus, when a PN junction is made, the useful layer is protected over most of its upper face 208 by cadmium gradients. In other words, the useful layer is made less sensitive to any contamination by the environment. Furthermore, when making a PN junction, defects related to ionic implantation will be localised in a larger gap material.

Therefore it can be seen that the invention is particularly advantageous for detection of long wavelengths, in the long wave infrared (LWIR), or even the very long wave infrared (VLWIR, corresponding to wavelengths exceeding 8 μm at 80 K). If these wavelengths are to be detected, a very low cadmium concentration is necessary in the second doped zone 252 (x<0.3, for example x=0.22) corresponding to high sensitivity of photodiodes to defects in the useful layer, in photodiode arrays according to prior art.

According to one variant not shown, the regions 24 with a high cadmium concentration extend deeper into the useful layer than the first doped zones 251. The regions can extend over part of the thickness of the useful layer or can pass through the useful layer over its entire thickness. As explained with reference to FIGS. 1 and 3, the result obtained is a photodiodes array with an optimal MTF (regions 24 completely separate from each other the pixels of the array). The result obtained is a low darkness current due to the presence of caisson edges 251 in the regions 24.

Considering the explanations given above, it is noted that in the embodiment of the photodiodes array shown in FIG. 3, the regions 14 stabilise part of the surface of the useful layer and this can reduce the darkness current.

Figure 5:
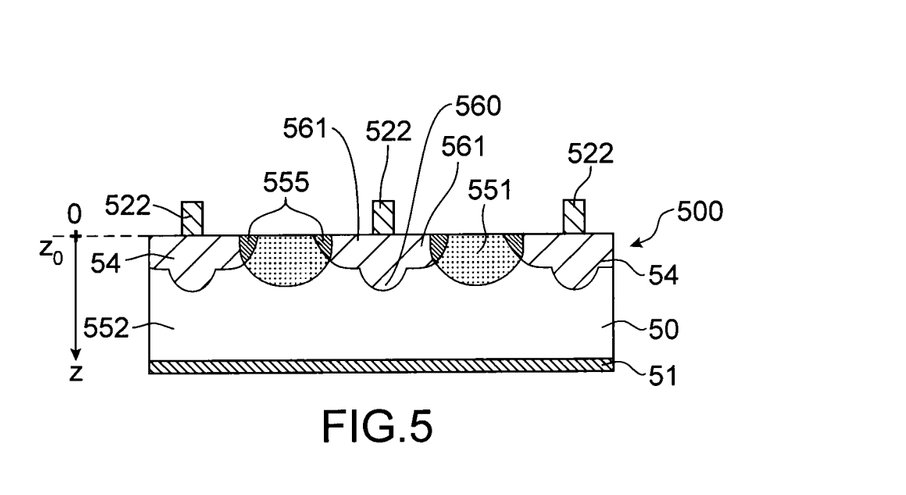

FIG. 5 shows a third embodiment of a photodiodes array 500 according to the invention.

FIG. 5 will only be described with reference to its differences from FIG. 4. Numeric references 20, 21, 24, 222, 251, 252, 255 in FIG. 4 correspond to numeric references 50, 51, 54, 522, 551, 552, 555 respectively in FIG. 5.

The photodiodes array 500 was made using a method according to the invention involving:
 steps 100 to 102 as described with reference to FIG. 1, such that each region 54 has a first portion 560 with a cadmium concentration gradient like that described with reference to FIGS. 1 and 3, that extends deep into the useful layer and outside the first doped zones 551;
 a step to eliminate the layer that corresponds, after annealing, to the structured layer formed in step 101; then
 steps 200 to 202 as described with reference to FIG. 2, such that each region 54 has a second portion 561 with cadmium concentration gradient as described with reference to FIGS. 2 and 4, and that extends shallow into the useful layer and that partially covers the first doped zones 551.

A step to make a PN junction is implemented for example before step 100, or after step 202, or between steps 102 and 200.

Thus, the photodiodes array 500 combines the advantages mentioned above for the photodiodes array 300 shown in FIG. 3 and the photodiodes array 400 shown in FIG. 4.

All types of variants could be imagined involving one or several cycles including steps like those described with reference to FIG. 1 or 2, of making a structured layer rich in cadmium and annealing. Advantageously, the layer corresponding, after annealing, to the previously formed structured layer, is eliminated between two cycles. Each cycle can implement a different shape of structured layer.

The invention is not limited to the examples that have just been mentioned, and all sorts of variants could be imagined with different shapes of regions with a cadmium gradient. These shapes could be obtained using methods according to the invention, by an appropriate structured layer and possibly by the use of several cycles like those described above.

Furthermore, these regions may pass through the entire thickness of the useful layer.

The invention claimed is:

1. A photodiodes array comprising:
 a useful layer made of a semiconducting alloy of cadmium, mercury and tellurium of the $Cd_xHg_{1-x}Te$ type, the useful layer having an upper face and a lower face;
 at least two first doped zones, located in the useful layer, each forming a PN junction with a second doped zone surrounding the first doped zones, the PN junctions being flush with the upper face of the useful layer;
 wherein the array comprises at least one region, located between two neighbouring PN junctions, and has a cadmium concentration gradient decreasing from the upper face to the lower face of the useful layer.

2. The array according to claim 1, wherein the average concentration of cadmium in said region is higher than the average concentration of cadmium in the remainder of the useful layer.

3. The array according to claim 1, wherein said region extends between two PN junctions, and outside each first doped zone.

4. The array according to claim 3, wherein said region extends in the useful layer deeper than the first doped zones.

5. The array according to claim 1, wherein said region extends between two PN junctions, and in an upper peripheral volume of each of the first doped zones.

6. The array according to claim 5, wherein said region extends in the useful layer less deep than the first doped zones.

7. The array according to claim 5, wherein said region extends in a first doped zone over less than half of the volume of this first doped zone.

8. The array according to claim 1, wherein said region has:
 a first portion extending outside the first doped zones; and
 a second portion extending in an upper peripheral volume of at least one first doped zone;
 the first portion extending deeper in the useful layer than the second portion, and the first portion being surrounded by the second portion.

9. The array according to claim 1, wherein the first doped zone is P-doped by arsenic atoms.

10. A method of fabrication of a photodiodes array according to claim 1, comprises the following steps:
 producing, on the upper face of the useful layer, a structured layer with at least one through opening, and with a cadmium concentration higher than the cadmium concentration in the useful layer;
 annealing of the useful layer covered by the structured layer, with diffusion of cadmium atoms of the structured layer, from the structured layer to the useful layer;
 producing at least two PN junctions in the useful layer.

11. The method according to claim 10, wherein the production of a structured layer involves:
   depositing of a reservoir layer on the upper face of the useful layer; and
   etching of at least one through opening in the reservoir layer, the etching being a chemical etching.

12. The method according to claim 10, wherein the steps of production of a structured layer and annealing form a fabrication cycle, and at least two fabrication cycles are implemented.

13. The method according to claim 10, wherein the step of production of the PN junctions make use of an arsenic ion implantation.

14. The method according to claim 10, wherein annealing is done at a temperature of between 100° C. and 500° C.

15. The method according to claim 14, wherein annealing is done for a duration of between 1 hour and 100 hours.

* * * * *